United States Patent
Harris, IV (10) Patent No.: US 6,547,597 B2
(45) Date of Patent: Apr. 15, 2003

(54) APPARATUS AND METHOD FOR INCORPORATING SURFACE MOUNT COMPONENTS INTO CONNECTORS

(75) Inventor: Edwin James Harris, IV, Deerfield, IL (US)

(73) Assignee: Littelfuse, Inc., Des Plaines, IL (US)

( * ) Notice: Subject to any disclaimer, the term of this patent is extended or adjusted under 35 U.S.C. 154(b) by 0 days.

(21) Appl. No.: 09/682,018

(22) Filed: Jul. 10, 2001

(65) Prior Publication Data

US 2003/0013344 A1 Jan. 16, 2003

(51) Int. Cl.[7] ............................................. H01R 13/66
(52) U.S. Cl. ........................................ 439/620; 439/676
(58) Field of Search ................ 439/620, 76.1, 439/856, 83, 676

(56) References Cited

U.S. PATENT DOCUMENTS

| | | | |
|---|---|---|---|
| 4,516,815 A | | 5/1985 | Venable et al. |
| 4,600,256 A | * | 7/1986 | Anttila ........................ 439/620 |
| 4,758,921 A | * | 7/1988 | Hung .......................... 439/620 |
| 4,813,891 A | | 3/1989 | Walters et al. |
| 4,992,233 A | | 2/1991 | Hyatt |
| 5,099,380 A | | 3/1992 | Childers et al. |
| 5,183,698 A | | 2/1993 | Stephenson et al. |
| 5,213,517 A | | 5/1993 | Kerek et al. |
| 5,278,535 A | | 1/1994 | Xu et al. |
| 5,340,641 A | | 8/1994 | Xu |
| 5,411,420 A | * | 5/1995 | Dennis ......................... 439/83 |
| 5,476,714 A | | 12/1995 | Hyatt |
| 5,569,056 A | * | 10/1996 | Raimond ..................... 439/83 |
| 5,647,767 A | * | 7/1997 | Scheer et al. .............. 439/620 |
| 5,669,381 A | | 9/1997 | Hyatt |
| 5,781,395 A | | 7/1998 | Hyatt |
| 6,129,561 A | * | 10/2000 | Lok .......................... 439/76.1 |
| 6,171,136 B1 | | 1/2001 | Liu et al. |
| 6,183,308 B1 | * | 2/2001 | Laity ......................... 439/620 |
| 6,244,878 B1 | * | 6/2001 | Pan .......................... 439/76.1 |
| 6,257,930 B1 | | 7/2001 | Yu |
| 6,276,943 B1 | * | 8/2001 | Boutros et al. ............ 439/76.1 |
| 6,383,024 B1 | | 5/2002 | Wang et al. |

* cited by examiner

Primary Examiner—Gary Paumen
Assistant Examiner—Felix O. Figueroa
(74) Attorney, Agent, or Firm—Bell, Boyd & Lloyd LLC (57) ABSTRACT

An apparatus and method for incorporating surface mount components into connectors. In an embodiment, an apparatus that houses a printed circuit board having a surface mount component is provided. The apparatus includes a body. A plurality of leads are fixed to the body so that an external electrical device is enabled to electrically communicate with the leads. A clip extends from each lead and receives an end of a printed circuit board.

29 Claims, 5 Drawing Sheets

APPARATUS AND METHOD FOR INCORPORATING SURFACE MOUNT COMPONENTS INTO CONNECTORS

BACKGROUND OF THE INVENTION

The present invention generally relates to electrical connectors. More specifically, the present invention relates to placing electrical components into connectors.

Since the 1960's, the trend in surface mount technology has been smaller, faster and cheaper. The trend in the growth of memory chip performance, in particular, had been that each new chips contained roughly twice as much capacity as its predecessor, and each chip was released within 18 to 24 months of the previous chip. As this trend continued, computing power rose exponentially. Further, while computing speed increased, the cost of transistors has plummeted some ten million fold in the last 40 years. Few other industries can claim a similar cost improvement, particularly over such a short time.

The major reason for such innovation is that by making smaller components, performance and cost get better simultaneously. By making smaller components, more components can be packed onto a given area of the silicon. This trend remains remarkably accurate. However, people have been wondering when the trend in increasing the performance of memory chips will slow. This concern becomes a reality in the age of $0.10\mu$ technology because the insulating oxide layers are exceedingly thin and have breakdown voltages as low as several volts.

Another problem arises in the manufacturing of these microcircuits. Currently, silicon technology is capable of attaining feature sizes of $0.13\mu$. Using a deep ultraviolet lithography technique, circuits can be printed as small as $0.10\mu$. Because $0.13\mu$ technology already is under production, a $0.10\mu$ limit is expected to be reached around 2004 to 2005. The problem arises in that images cannot be made much smaller than the wavelength of the light used to make the images. Circuits less than $0.10\mu$ may be impossible given the current manufacturing technology. Efforts are underway, however, to develop an apparatus and process that uses x-ray lithography, which has a shorter wavelength so that circuits as small as $0.03\mu$ can be produced.

Of course, in this field there are different means to the same end. It is likely that more and more of the breakthroughs will come from the area of packaging rather than silicon design. It is known that packages that house the silicon reduce the performance of the chips. Undesired leads (outside the package) and bond wires (inside the package) produce inductance and capacitance that distort and delay signal propagation and interfere with data transmission. Additionally, circuit board traces that connect different silicon packages contribute parasitic effects that can further degrade performance.

The challenge for engineers in component packaging and printed circuit assembly in lies in enhancing package and printed circuit board ("PCB") performance to improve silicon performance. To achieve the highest performance, the package is removed and bare silicon is used. The terms used for mounting bare silicon are chip-on-board ("COB"), flip chip and direct chip attach ("DCA"). Each term represents a different process. With any of these chip scale processes, traditionally copper clad PCB's will have to be adapted to accommodate the fine lines and microvias needed for interconnecting high-pin count and lower pitch packages (or bare silicon). The PCB assembly industry will have to build boards with finer features and smaller vias in a cost-effective manner.

One primary concern for packaging and board layout engineers is flexibility. Adapting a PCB to improve silicon, performance is likely to be impeded by electronic components on the PCB that are required for the proper functioning of the circuit. These components may, for example, be for filtering, DC blocking, fusing, over-voltage protection, transmission line termination, etc.

It is therefore desirable and will become increasingly more desirable to provide an apparatus and method for reducing the board space required for these electronic components so that they will not impede PCB improvements, which will require tighter and tighter spacing. Furthermore, it is always desirable, for cost and reliability purposes, to reduce the number of components that are required to be mounted to the PCB.

SUMMARY OF THE INVENTION

The present invention provides an apparatus and method for incorporating components into connectors. The components of the present invention may be surface mount components, in which case board space is conserved because the components mounted inside the connectors would otherwise have to be mounted elsewhere on the PCB. The connectors of the present invention may also attach to a suitable cable, in which case board space is conserved because the components mounted inside the connector are eliminated from having to be mounted to the PCB altogether.

To this end, in an embodiment, an apparatus that houses a printed circuit board having a surface mount component is provided. The apparatus includes a body. A plurality of leads are fixed to the body so that an external electrical device is enabled to electrically communicate with the leads. A conductive clip extends from each lead and receives an end of a printed circuit board.

In an embodiment, the body is plastic.

In an embodiment, the body defines a guide that guides and supports the printed circuit board.

In an embodiment, the body defines a locking device that retains the printed circuit board.

In an embodiment, the locking device is a snap-fit device.

In an embodiment, the clip has ends that receive the printed circuit board.

In an embodiment, the clip includes solder that reflows to a conductive trace on the printed circuit board.

In an embodiment, the body is a body of an RJ-45 connector.

In an embodiment, the body is a body of a Universal Serial Bus connector.

In an embodiment, the body is adapted to be surface mounted.

In an embodiment, the body is adapted to be attached to a cable.

In an embodiment, the body is adapted to be through-hole mounted.

In another embodiment of the present invention, a connector is provided. The connector includes a body. A number of leads are fixed to the body so that an external electrical device can electrically communicate with the leads. A conductive clip extends from at least one of the leads. The clips receive a printed circuit board. An electrical component is soldered to the board. A conductive trace is formed on the board. The trace electrically communicates with the electrical component and the clips.

In an embodiment, the electrical component is an over-voltage protection device.

In an embodiment, the electrical component is an overcurrent protection device.

In an embodiment, the electrical component is a filtering device.

In an embodiment, the electrical component is a fuse.

In an embodiment, the conductive clip is a first conductive clip and the electrical component is a first electrical component, the connector further includes a second conductive clip that extends from another one of the leads and is in contact with the printed circuit board. Conductive traces are formed on the printed circuit board and electrically communicate with the second electrical component and the second clip.

In an embodiment, the first electrical component electrically communicates with

In a further embodiment of the present invention a connector is provided. The connector at includes a body and number of leads fixed to the body so that an external electrical device can electrically communicate with the leads. Conductive clips extend from the plurality of leads. A printed circuit board is received by the conductive clips. An electrical component and a conductive trace are provided on the printed circuit board. The conductive trace electrically communicates with the electrical component and the conductive clips.

In a further embodiment of the present invention a method of making a connector is provided. The method includes providing a body and preparing a number of leads so that each lead has an extending conductive clip. The leads terminate so that an external electrical device is enabled to electrically communicate with the leads. The method includes preparing a printed circuit board having a surface mount component and conductive traces that electrically communicate with the component. The method also includes inserting the printed circuit board into the clips so that the traces electrically communicate with the clips.

In an embodiment, the step of providing the body includes molding a plastic body to include a guide and a locking device for the board.

In an embodiment, the step of preparing the body includes inserting continuous strips of clip bearing leads into the body and stamping the strips so that the body and a set of secured strips comes free.

In an embodiment, the step of preparing the printed circuit board includes forming the traces onto the board, placing solder paste onto solder pads defined by the traces and placing the component onto the solder paste.

In an embodiment, preparing the board includes populating components for a plurality of boards on a single piece of substrate and separating the piece into individual boards.

In an embodiment, inserting the board into the clips of the body includes locking the board to the body.

In an embodiment, the method includes the step of reflowing the body and the board so that solder adhered to the clips secures electrical communication between the leads of the body and the traces of the board.

It is therefore an advantage of the present invention to provide a body for a connector that is adapted to receive a daughter PCB board with one or more components that would otherwise have to be mounted to the main PCB.

Another advantage of the present invention is to provide an apparatus and method for easily installing the daughter PCB into the connector body.

A further advantage of the present invention is to provide an apparatus and method for reducing the number of components that a board assembler has to solder to the main PCB.

Yet another advantage of the present invention is to provide an apparatus and method that is adaptable to include many known connector types and configurations.

Additional features and advantages of the present invention will be described in, and apparent from, the following Detailed Description of the Preferred Embodiments and the Drawings.

DETAILED DESCRIPTION OF THE INVENTION

Figure 1:
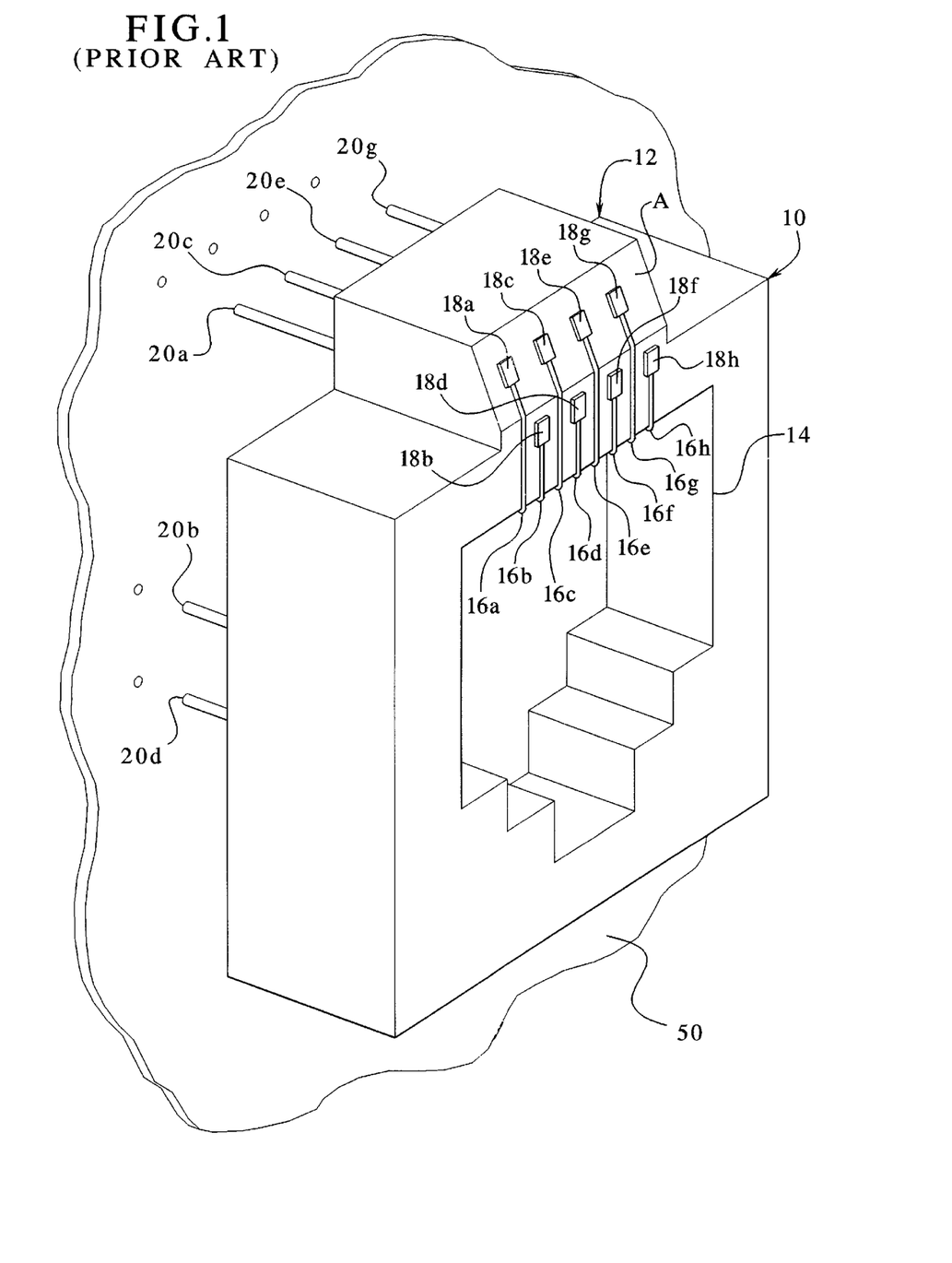
FIG. 1 is a perspective view of one type of connector that may be adapted to employ the printed circuit board mounting apparatus and method of the present invention.

Referring now to the drawings and in particular to FIG. 1, one type of connector 10 that may be adapted to employ the apparatus and method of the present invention is illustrated. The connector 10 is an RJ-45 connector, which is commonly used in data networks, including local area networks ("LANS"), wide area networks ("WANS") and the like. The present invention, however, applies to any type of connector including, but not limited to, any Universal Serial Bus ("USB") compliant connector (including USB 1.0 and 2.0), any Firewire compliant connector, DIN connectors, D sub-connectors, socket connectors, card edge connectors, flex connectors and power connectors.

The connector 10 as illustrated is adapted to be a through-hole connector mounted to a PCB. The present invention, however, includes connectors that surface mount and panel mount. The connectors can also be plugs or jacks that attach to suitable cables.

The connector 10 includes a body 12 that is plastic or other suitable material. The body 12 defines a cavity 14 that receives another electrical device, such as a plug (not shown). The plug has electrical leads that mate with leads 16a through 16h of the connector 10. The leads 16a through 16h each have a first end 18a through 18h that terminates in an area A of the body 12. Each of the leads 16a through 16h, for the illustrated through-hole connector 10, also have a second end 20a, 20b, 20c, etc. that extends from the body 12. The second ends 20a, 20b, 20c, etc. (or termination ends) enable the connector 10 to be inserted, in through-hole fashion, onto a PCB 50 to be wave soldered. In another configuration, e.g., a surface mount connector, the ends 20a to 20h may be adapted to be reflow soldered to the PCB 50. In such applications, the termination ends 20, 20, 20c, etc., are gull wing or j-lead terminations, or the like. In still other configurations, the ends 20a to 20h terminate at a quick disconnect or other known cable attachment device 60. It should be appreciated that the leads 16a through 16h are configured and terminate according to the type and configuration of the connector. Although the data transfer connector 10 includes eight leads 16a through 16h, other types of connectors may have any number of leads.

Figure 2:
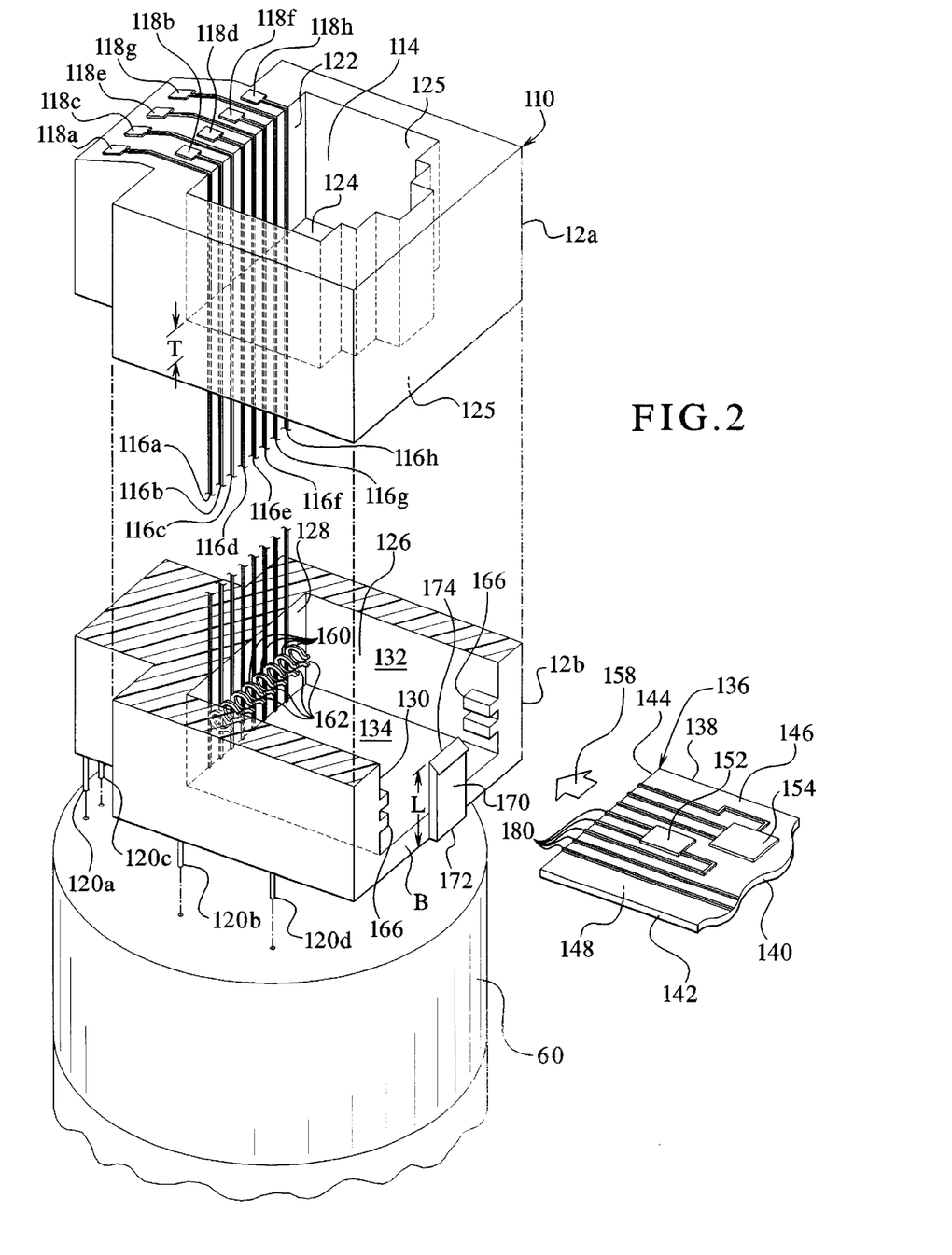
FIG. 2 is a sectioned perspective view of the connector of FIG. 1, which has been adapted to become the printed circuit board mounting apparatus of the present invention.

Referring now to FIG. 2, the connector 10 of FIG. 1 has been modified according to the present invention to produce a connector 110. For purposes of illustration, the connector 110 is shown segmented into first and second body portions 12a and 12b, respectively, so that components of the present invention that would otherwise be difficult to see may be illustrated.

The connector 110 of FIG. 2 is rotated with respect to the connector 10 of FIG. 1 and is now illustrated in its mounting position. The connector 110 has a number of leads 116a, 116b, 116c, etc., that have first ends 118a, 118b, 118c, etc. and second ends 120a, 120b, 120c, etc. In FIG. 2, the second ends (or termination ends) 120a, 120b, 120c, etc. extend downward.

The connector 110 includes a first cavity 114. The first cavity 114 is defined by inner surfaces of the first body portion 12a. The first cavity 114 has side walls 122 and 125 and a back wall 124. The back wall 124 defines the back of the cavity 114. That is, when an external electrical mating plug (not shown) is inserted into the connector 110, the mating plug bottoms-out against the back wall 124. The mating plug also electrically communicates with the leads 116a to 116h along the side wall 122.

The leads 116a to 116h extend from their ends 118a to 118h along the side wall 122 and through the back wall 124. The leads extend through a thickness T of material under the back wall 124. The leads 116a through 116h thereafter extend from an underside 125 of the first body portion 12a into a second cavity 126. The second cavity 126 is defined by inner surfaces of the second body portion 12b. The cavity 126 includes first, second and third side walls 128, 130, 132, respectively, and a back wall 134. In the second cavity 126, the leads 116a to 116h extend along the side wall 128, which in an embodiment is substantially coplanar with the side wall 122.

FIG. 2 also shows a miniature PCB 136, which is commonly called a "daughter board." In an embodiment, the daughter board PCB 136 has four ends 138, 140, 142, 144, a top side 146, and a bottom side 148. The PCB 136 includes components 152, 154, which are soldered or otherwise attached to the PCB. The second cavity 126 is adapted to receive the miniature PCB 136. In this regard, the cavity 126 is suitably sized to accommodate the length and width of PCB 136 as well as the height of any electrical components, such as the components 152, 154.

The side wall 128 provides support for the leads 116a to 116h when the PCB 136 slides in the direction of arrow 158 into contact with the leads 116a to 116h. The leads extend through the back wall 134 of the cavity 126, make a right angle turn through the wall 128 or otherwise wind their way through the body portion 12b and terminate at their ends 120a, 120b, 120c, 120d, etc., which can be mounted to a PCB 50 or a cable attachment device 60.

The leads 116a to 116h each include a clip 160. The clips 160 extend outwardly from the side wall 128 so that an opening 162 of the clip 160 can receive the end 144 of PCB 136. In an embodiment, the clips 160 of each lead 116a to 116h are positioned the same or substantially the same vertical distance above the wall 134, so that the clips 160 form a row. The row of clips 160 is maintained so that components 152 and 154 "clear" or do not impinge the underside 125 of the first body portion 12a, i.e., the top of cavity 126.

The PCB 136 slides into the cavity 126 (in the direction of arrow 158) through a pair of guides 166. In an embodiment, the guides 166 are disposed along side walls 130 and 132. The guides 166 are adapted to receive the ends 138, 142 of PCB 136. In a preferred embodiment, the guides 166 are positioned towards the opening of the cavity 126. In this regard, the clips 160 support one end 144 of PCB 136 and the guides 166 support an opposite end 140 of the PCB. In this example, the guides 166 are molded integrally with the second body portion 12b. Alternatively, the guides 166 may be attached or adhered to the body 12a/12b after the body is formed. The guides 166 are of any suitable length necessary to guide and hold the PCB 136. For example, the guides 166 may extend the length of the side walls 130 and 132 and substantially support the ends 138, 142 of the PCB 136. Moreover, the second body portion 12b may be adapted to have any number of guides or sets of guides.

The body 12a/12b also includes a locking device 170. In the illustrated embodiment, the locking device 170 is a tab that has two ends 172, 174 and a length L. The first end 172 is attached to an area B of the second body portion 12b. Similar to the guides 166, the locking device 170 may be integrally molded to the body portion 12b or, alternatively, attached to area B of the body portion 12b at a later stage in manufacturing. The second end 174 of the locking device 170 cantilevers upwardly from the second body portion 12b. The locking device 170 is made of a material that is able to flex back and forth or rotate out of the way. The locking device 170 extends upwardly along length L so that the end 174 prevents the PCB 136 from sliding out of the cavity 126 after the PCB is inserted into place. In an embodiment, either the guides 166 have adequate clearance and/or are positioned closer to wall 128, or the PCB 136 flexes so that it slides over the end 174 of the tab 170. The locking device 170 may also be adapted to snap-fit or press-fit PCB 136 into the openings 162 of the clips 160.

In another embodiment (not illustrated), the locking device 170 is again a cantilevered tab that now attaches to the body portion 12a and extends downwardly from the portion to cover a part of the opening of the cavity 126. In a further embodiment (not illustrated), the locking device is also a cantilevered tab that now attaches to the side wall 128 or the back wall 134 and extends substantially horizontally, underneath the PCB 136. In this example, the horizontally extending locking device may have a lip at its cantilevered end that extends upwardly and engages an end of the PCB 136 once the PCB is slid into place. Either of these alternative embodiments for the locking device may also be adapted to press-fit or snap-fit PCB 136 into the openings 162 of the clips 160.

As described above, the PCB 136 has a top side 146 and a bottom side 148. A plurality of conductive traces 180 are formed (or patterned) onto one or both sides 146, 148 of the PCB 136 and terminate at the end 144 of PCB 136. In an embodiment, the traces 180, the leads 116 and the clips 160 are made of copper. Alternatively, these can be constructed of any suitable conductive metal, alloy or other material. The electrical components 152 and 154 can likewise be soldered to one or both sides 146, 148 of the PCB 136. Although PCB 136 is shown as having two components 152, 154, the connector 110 can house any number of electrical components, which perform any desired electrical function or functions.

When PCB 136 is inserted into the second cavity 126, the openings 162 of the clips 160 receive the traces 180 at, for example, the end 144 of the PCB. The clips 160 thereafter electrically communicate with the traces 180. The leads 116 therefore electrically communicate with the components 152 and 154.

Figure 3A:
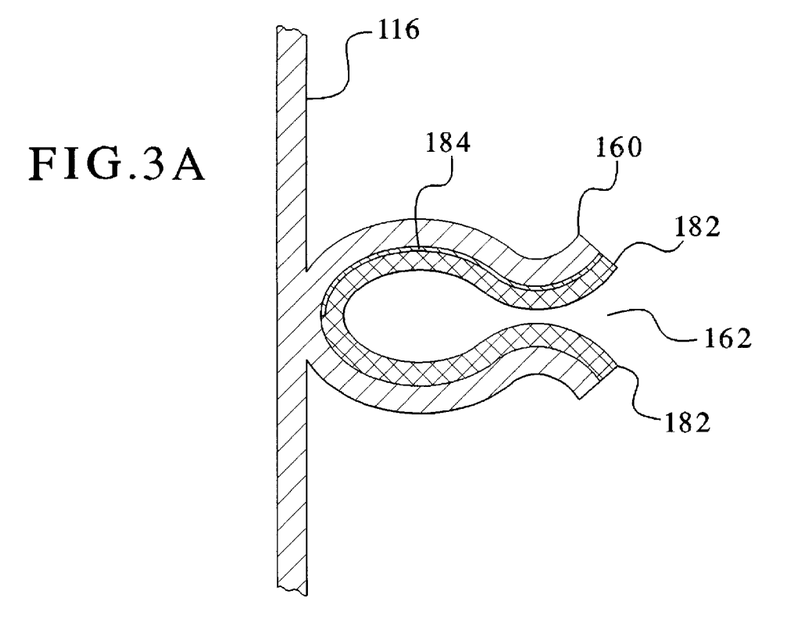
FIG. 3A is an elevation view of a lead clip of the present invention, which is adapted to receive a printed circuit board.

FIG. 3A shows one of the leads 116 and the clip 160. The clip 160 defines the opening 162 that is adapted to receive a PCB 136. The clip 160 has a layer of solder 182. The solder 182 may also entrain a pocket or layer of solder flux 184. Solder and flux bearing leads or leadframes, such as the lead 116/clip 160 combination, are known in the art and may be obtained from various companies, such as Die-Tech, which is located in York Haven, Pa. and NAS Interplex, which is located in Flushing, N.Y. The solder and flux bearing leads or leadframes may be configured in a variety of ways to accommodate different PCB thicknesses and different widths for the conductive traces that are etched onto the PCB.

Figure 3B:
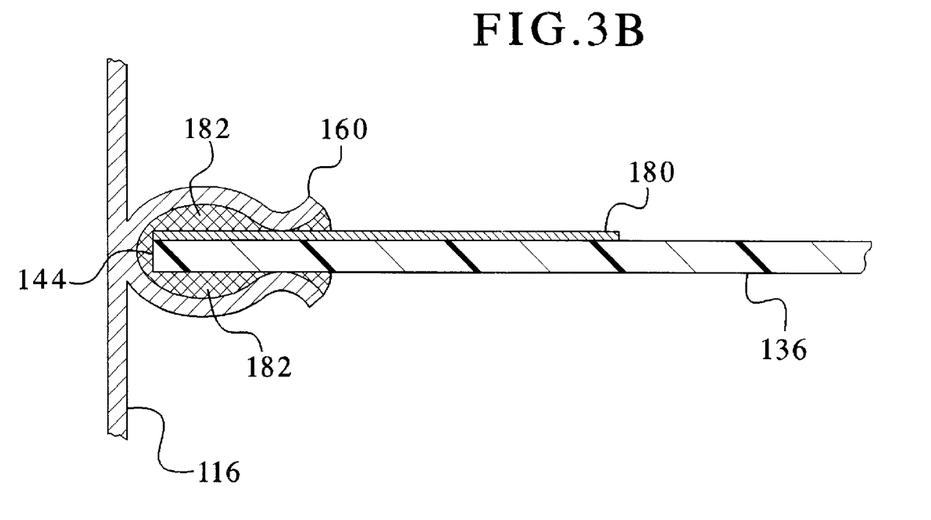
FIG. 3B is an elevation view of the lead clip of FIG. 3A, which shows how the board has been soldered to the clip.

Referring now to FIG. 3B, the clip 160 illustrated in FIG. 3A is shown having the end 144 of PCB 136 soldered in place. The lead 116 and the clip 160 thereafter electrically communicate with the trace 180. In an embodiment, the connector 110 (FIG. 2) is reflow soldered, which is well known in the art. During reflow soldering, the solder flux 184 is activated and causes the solder 182 to melt. The solder 182 flows, cools and hardens to create a conductive fillet between the conductive trace 180 and the conductive clip 160. The solder 182 can be any solder known in the art and is commonly a mixture of lead and tin. There are also a variety of fluxes available to be used as the flux 184, which generally functions to remove oxides from the clip 160 and the trace 180, to produce a better intermetallic bond between the clip 160 and the trace 180.

Figure 4:
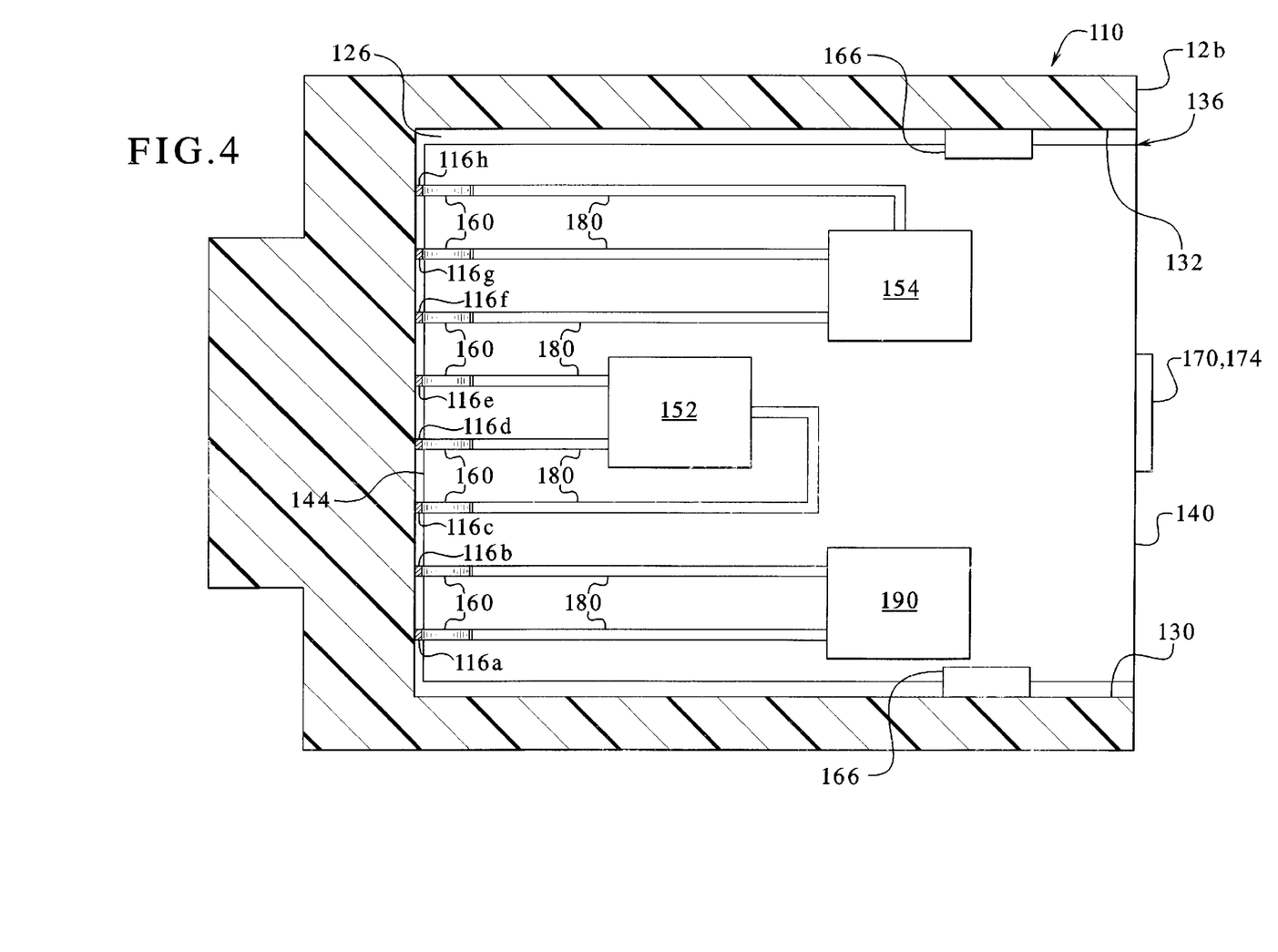
FIG. 4 is a plan view of a section of a connector of the present invention that illustrates the printed circuit board mounted to the connector body.

Referring now to FIG. 4, the body portion 12b of the connector 110 is illustrated. In this example, the side walls 130 and 132 defining the cavity 126 have received the PCB 136 via the guides 166. The guides 166 extend from each of the walls 130 and 132 and constrain movement of the PCB 136. The locking device 170, 174 snaps or clips over the end 140 of the PCB 136, so that the PCB 136 cannot thereafter slide out of the cavity 126. In an embodiment, the locking device 170 press-fits the PCB 136 against the clips 160, which are supported by the body portion 12b.

The clips 160 of the body portion 12b have received the traces 180 at the end 144 of the PCB 136. The clips 160 electrically communicate with the leads 116a to 116h of the body portion 112b. The traces 180 electrically communicate with the electrical components 152, 154 and 190. In an embodiment, the PCB (or daughter board) 136 has been previously prepared so that the components 152, 154 and 190 are already soldered in place. The components 152, 154 and 190 can be any desired electrical components so long as they are small enough or the body 12a/12b is big enough to house the one or more components.

In an embodiment, one or more components is an electrostatic discharge ("ESD") adz suppressor, such as a PulseGuard® ESD suppressor produced by the assignee of this invention. In an embodiment, one or more components is a multilayer varistor ("MLV"). In an embodiment, one or more components is an overcurrent protection device, such as a positive temperature coefficient ("PTC") thermistor device. In an embodiment, one or more components is a fuse. In an embodiment, one or more components is any one of a filter, a capacitor/DC blocking component or transmission line termination, etc. In certain embodiments, one or more components may be electrically connected via one or more traces 180 to one or more other electrical components.

In an embodiment, a plurality of PCB's 136 are made at one time. The copper traces 180 for the PCB 136 are formed or patterned in a plurality of places onto a larger substrate ("not illustrated"), e.g., an FR-4 or other suitable substrate material, through photolithography as is known in the art. The process also leaves copper pads on the larger substrate, which connect to or electrically communicate with the traces 180. Solder paste is screen printed onto the pads of the larger substrate. A known pick and place machine (not illustrated) places electrical components, such as the components 152, 154 and 190, onto the pasted pads of the larger substrate. A reflow oven reflows the entire substrate and creates a plurality of complete PCBs 136. A router or other type of device separates the larger substrate into individual PCBs.

In an embodiment, the connector body 12a/12b is molded as one piece with integrally formed guides 166 and locking device 170. The leads 16 having the solder/flux laden clips 160 are prepared in mass and are provided as a string or strip of solder bearing leads 16. The string is assembled to the body 12a/12b via a stitching machine or other suitable machine. The body 12a/12b has locking mechanisms (not illustrated) which lock a set of the solder bearing leads 116 into the body 12a/12b. The strip of leads is then stamped or crimped so that the body and an attached set of leads 116 comes free.

The PCB 136 loaded with components then slides into the cavity 126 of the body 12a/12b, through the guides 166, and is secured by the locking device 170. Since the PCB 136 is fixed by the clips 160, the guides 166 and the locking device 170, the connector 110 does not have to be immediately reflow soldered to melt the solder in the clips 160. If the connector 110 is itself a surface mount component, it can be shipped, placed on a main printed circuit board, wherein the daughter PCB 136 and the main printed circuit board are both reflow soldered at once. If the connector 110 is a panel mount or stand alone connector, the connector may otherwise be reflow soldered before it is shipped.

Figure 5:
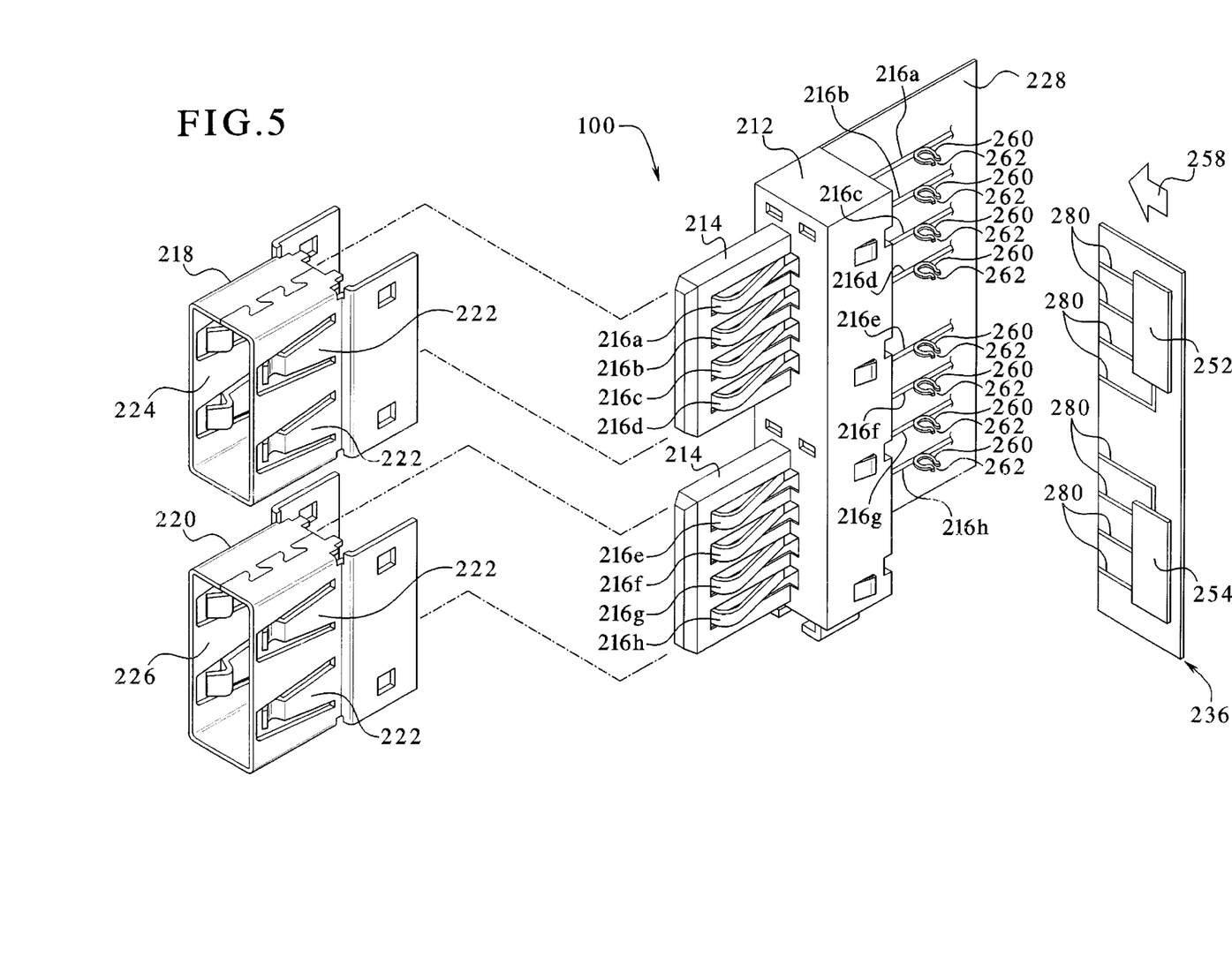
FIG. 5 illustrates the present invention in cooperation with a Universal Serial Bus connector.

Referring now to FIG. 5, one embodiment of the present invention employed in a Universal Serial Bus ("USB") connector 100 is illustrated. Only the pertinent portion of the connector 100 is illustrated, and the connector 100 is illustrated in an exploded format for ease of illustration. The USB connector 100 includes an insulative body 212. As is typical for USB connectors, USB connector 100 includes at least one insulative projection 214 that extends from the insulative body 212. The projections 214 hold a plurality of leads 216a to 216h. As is typical for USB connectors, USB connector 100 includes one or more shields 218 and 220 that fit onto the insulative body 212, over the projections 214. The illustrated embodiment shows a vertically stacked USB connector 100. However, any type of USB connector may be modified for the present invention. It is also typical forth projections 214 and shields 218 and 220 can be rotated ninety degrees from the orientation illustrated. The shields 218 and 220 each define a series of tongues 222. The shield 218 defines opening 224, and the shield 220 defines opening 226. One or more mating connectors inserts into the openings 224 and 226 and makes electrical contact with leads 216a to 216h, wherein the tongues, as is well known, apply a spring force to maintain the physical electrical contact.

The USB connector 100 otherwise includes the components as described above for the RJ-type connector. An inner wall 228 extends from the insulating base 212. The leads 216a to 216h extend along the inner wall 228 as described above. The leads 216a to 216h as described above each include a clip 260, wherein the clips 260 align so as to form an insertion plane for one end of a PCB 236. Each of the clips 260 defines an opening 262, which enables PCB 236 to slide into the body 212 (in the direction of arrow 258). When PCB 236 has been inserted into the clips 260, clips 260 make electrical contact with traces 280 laid upon PCB 236 as described above. Further as described above, traces 280 electrically communicate with one or more components 252 and/or 254. Components 252 and 254 can be any of the electrical devices described above.

What is claimed is:

1. A connector comprising:
   a body providing a first opening that receives a mating connector;
   a plurality of leads, each lead having a contact portion that communicates electrically with the mating connector and a terminal portion that makes an electrical connection with a conductive portion of a mount, the leads being continuous from the contact portion to the terminal portion and extending along an internal wall of a second opening provided by the body so that a circuit protection device carried by a printed circuit board communicates electrically with the leads when the printed circuit board is inserted into the second opening; and
   a conductive clip extending from each lead between the contact portion and the terminal portion, the clips receiving an end of the printed circuit board.

2. The apparatus of claim 1, wherein the body is plastic.

3. The apparatus of claim 1, wherein the body defines a guide that guides and supports the printed circuit board.

4. The apparatus of claim 1, wherein the conductive clip has ends that receive the printed circuit board.

5. The apparatus of claim 1, wherein the conductive clip includes solder that reflows to a conductive trace on the printed circuit board.

6. The apparatus of claim 1, wherein the body is a body of an RJ-45 connector.

7. The apparatus of claim 1, wherein the body is a body of a Universal Serial Bus connector.

8. The apparatus of claim 1, wherein the body is surface mounted to the mount via the terminal portion of the lead.

9. The apparatus of claim 1, wherein the the mount is attached to a cable.

10. The apparatus of claim 1, wherein the body is through-hole mounted to the mount via the terminal portion of the lead.

11. The apparatus of claim 1, wherein the body defines a locking device that retains the printed circuit board.

12. The apparatus of claim 4, wherein the locking device is a snap-fit device.

13. A connector having circuit protection comprising:
    a body providing a first opening that receives a mating connector;
    a plurality of leads extending along an internal wall of a second opening, each lead having a contact portion that communicates electrically with the mating connector and a terminal portion that makes an electrical connection with a conductive portion of a mount, the leads being continuous from the contact portion to the terminal portion, the second opening provided by the body so that a circuit protection device carried by a printed circuit board communicates electrically with the leads when the printed circuit board is inserted into the second opening;
    a conductive clip extending from at least one of the plurality of leads between the contact portion and the terminal portion, wherein the clip receives an end of the printed circuit board; and
    a conductive trace on the printed circuit board, wherein the conductive trace electrically communicates with the circuit protection device and the conductive clip.

14. The connector of claim 13, wherein the circuit protection device is an overvoltage protection device.

15. The connector of claim 13, wherein the circuit protection device is an overcurrent protection device.

16. The connector of claim 13, wherein the circuit protection device is a fuse.

17. The connector of claim 13, wherein the conductive clip is a first conductive clip and the circuit protection device is a first circuit protection device, the connector further comprising;
    a second conductive clip extending from another one of the plurality of leads and in contact with the printed circuit board; and
    a second conductive trace on the printed circuit board that electrically communicates with a second circuit protection device and the second clip.

18. The connector of claim 17, wherein the first circuit protection device electrically communicates with the second circuit protection device.

19. The connector of claim 13, wherein the conductive clip is a first conductive clip, the connector further comprising:
    a second conductive clip extending from another one of the plurality of leads and in contact with the printed circuit board; and
    a second conductive trace on the printed circuit board that electrically communicates with an electrical component and the second clip.

20. The connector of claim 19, wherein the circuit protection device electrically communicates with the electrical component.

21. The connector of claim 19, wherein the electrical component is selected form the group consisting of: a filter, a capacitor/DC component, and a transmission line termination.

22. A method of making a connector having circuit protection comprising the steps of:
    providing a first opening for receiving a mating connector in a body;
    placing a plurality of leads along an internal wall of a second opening provided by the body, each of the plurality of leads having a contact portion that communicates electrically with the mating connector, a terminal portion that makes an electrical connection with a conductive portion of a mount and a conductive clip placed along a continuous length of the leads from the contact portion to the terminal portion extending from the lead and aligned along the internal wall so that a printed circuit board can be received by the leads;
    preparing the printed circuit board having a circuit protection device and a plurality of conductive traces that electrically communicate with the circuit protection device; and
    inserting the printed circuit board into the plurality of clips so that the plurality of conductive traces electrically communicate with the clips.

23. The method of claim 22, wherein the step of providing the body includes molding a plastic body to include at least one guide and a locking device for the printed circuit board.

24. The method of claim 22, wherein the step of preparing the plurality of leads includes inserting continuous strips of clip bearing leads into the body and stamping the strips so that the body and a set of secured strips comes free.

25. The method of claim 22, wherein the step of preparing the printed circuit board includes forming the plurality of traces onto the printed circuit board, placing solder paste onto a plurality of solder pads defined by the plurality of traces and placing the circuit protection device onto the solder paste.

26. The method of claim 22, wherein the step of preparing the printed circuit board includes populating a plurality of circuit protection devices on a substrate and separating the substrate into individual printed circuit boards.

27. The method of claim 22, wherein the step of inserting the printed circuit board into the plurality of clips includes securing the printed circuit board to the body.

28. The method of claim 22, further comprising the step of reflowing the body and the printed circuit board so that solder adhered to the clips provides electrical communication between the plurality of leads and the traces of the board.

29. A connector having circuit protection comprising:

a body providing a first opening that receives a mating connector;

a plurality of leads extending along an internal wall of a second opening, each lead having a contact portion that communicates electrically with the mating connector and a terminal portion that makes an electrical connection with a conductive portion of a mount, the leads being continuous from the contact portion to the terminal portion, the second opening provided by the body so that a circuit protection device carried by a printed circuit board communicates electrically with the leads when the printed circuit board is inserted into the second opening;

a plurality of conductive clips extending from the plurality of leads between the respective contact portions and terminal portions, wherein the clips receive an end of the printed circuit board; and a conductive trace on the printed circuit board, wherein the conductive trace electrically communicates with the circuit protection device and at least one of the conductive clips.

* * * * *